(12) United States Patent
Kerrigan et al.

(10) Patent No.: US 9,606,168 B2
(45) Date of Patent: Mar. 28, 2017

(54) IRRADIANCE MAPPING LEVERAGING A DISTRIBUTED NETWORK OF SOLAR PHOTOVOLTAIC SYSTEMS

(71) Applicants: Shawn Kerrigan, Redwood City, CA (US); Michael Herzig, Edgewater, NJ (US)

(72) Inventors: Shawn Kerrigan, Redwood City, CA (US); Michael Herzig, Edgewater, NJ (US)

(73) Assignee: Locus Energy, Inc.

( * ) Notice: Subject to any disclaimer, the term of this patent is extended or adjusted under 35 U.S.C. 154(b) by 423 days.

(21) Appl. No.: 14/194,858

(22) Filed: Mar. 3, 2014

(65) Prior Publication Data
US 2014/0180637 A1 Jun. 26, 2014

Related U.S. Application Data

(60) Division of application No. 12/777,224, filed on May 10, 2010, now Pat. No. 8,725,459, which is a (Continued)

(51) Int. Cl.
*G06F 19/00* (2011.01)
*G01R 31/26* (2014.01)
(Continued)

(52) U.S. Cl.
CPC ...... *G01R 31/2605* (2013.01); *H02J 13/0062* (2013.01); *H02S 50/10* (2014.12); (Continued)

(58) Field of Classification Search
CPC combination set(s) only.
See application file for complete search history.

(56) References Cited

U.S. PATENT DOCUMENTS 3,872,286 A   3/1975  Putman
4,280,061 A   7/1981  Lawson-Tancred
(Continued)

FOREIGN PATENT DOCUMENTS

WO    0225987 A2    3/2002
WO    2006119031    11/2006

OTHER PUBLICATIONS

Hammer et al. 432,2005 Solar Energy Assessment Using Remote Sensing Technologies Remore Sensing of Environment 86, pp. 423-432, 2005.
(Continued)

*Primary Examiner* — Huan Tran
(74) *Attorney, Agent, or Firm* — Jennifer Meredith, Esq.; Meredith & Keyhani, PLLC

(57) ABSTRACT

A computer processor implemented method of developing irradiance mapping using a distributed network of solar photovoltaic systems, the method comprising the steps of: selecting a predetermined geographic area having at least five solar photovoltaic systems to provide a photovoltaic system; calibrating the photovoltaic system; reversing the photovoltaic system performance model using a computer processor to solve the irradiance input value; calculating irradiance according to irradiance input value, energy output and weather data using the computer processor to provide a single irradiance point; and mapping at least two single irradiance points to create an irradiance map.

9 Claims, 11 Drawing Sheets

Sample PV Configuration

Related U.S. Application Data continuation-in-part of application No. 11/949,035, filed on Dec. 2, 2007, now Pat. No. 7,742,897.

(51) Int. Cl.
  *H02J 13/00* (2006.01)
  *H02S 50/10* (2014.01)
  *H02J 3/38* (2006.01)

(52) U.S. Cl.
  CPC .............. *G06F 19/00* (2013.01); *H02J 3/383* (2013.01); *Y02E 10/563* (2013.01); *Y02E 40/72* (2013.01); *Y02E 60/7838* (2013.01); *Y04S 10/123* (2013.01); *Y04S 40/124* (2013.01)

(56) References Cited

U.S. PATENT DOCUMENTS

| | | | |
|---|---|---|---|
| 4,752,697 | A | 6/1988 | Lyons |
| 6,311,137 | B1 | 10/2001 | Kurokami |
| 7,020,566 | B2 | 3/2006 | Villicana |
| 7,133,787 | B2 | 11/2006 | Mizumaki |
| 7,742,897 | B2 | 6/2010 | Herzig |
| 8,682,585 | B1 | 3/2014 | Hoff |
| 8,725,459 | B2 * | 5/2014 | Herzig et al. ............... 702/182 |
| 2002/0033020 | A1 | 3/2002 | Tonomura |
| 2002/0143693 | A1 | 10/2002 | Soestbergen |
| 2004/0067746 | A1 | 4/2004 | Johnson |
| 2004/0103056 | A1 | 5/2004 | Ikeda |
| 2004/0138977 | A1 | 7/2004 | Tomkins |
| 2004/0148336 | A1 | 7/2004 | Hubbard et al. |
| 2004/0176965 | A1 | 9/2004 | Winch |
| 2004/0177027 | A1 | 9/2004 | Adachi |
| 2004/0230377 | A1 | 11/2004 | Ghosh |
| 2004/0236587 | A1 | 11/2004 | Nalawade |
| 2005/0004839 | A1 | 1/2005 | Bakker |
| 2005/0131810 | A1 | 6/2005 | Garrett |
| 2006/0271214 | A1 | 11/2006 | Brown |
| 2007/0162367 | A1 | 7/2007 | Smith |
| 2007/0174219 | A1 | 7/2007 | Bryant |
| 2007/0203860 | A1 | 8/2007 | Golden |
| 2007/0219932 | A1 | 9/2007 | Carroll |
| 2007/0226163 | A1 | 9/2007 | Robles |
| 2008/0091590 | A1 | 4/2008 | Kremen |
| 2008/0091625 | A1 | 4/2008 | Kremen |
| 2008/0172256 | A1 | 7/2008 | Yekutiely |
| 2008/0215500 | A1 | 9/2008 | De La Motte |
| 2009/0177458 | A1 | 7/2009 | Hochart |
| 2010/0219983 | A1 | 9/2010 | Peleg |
| 2010/0271222 | A1 | 10/2010 | Kerrigan |
| 2011/0282601 | A1 | 11/2011 | Hoff |
| 2013/0085885 | A1 | 4/2013 | Sahai |

OTHER PUBLICATIONS

Kroposki et al.Photovoltaic Module Energy Rating Methodology Development 25th PVSC, May 13-17, 1996.
'Atlas DCA', Peak electronic design, ltd., 2008.
Burger, Werner, Asset Securitisation, 2006, pp. 1-67.
Li, Danny HW, and Tony NT Lam. "Determining the optimum tilt angle and orientation for solar energy collection based on measured solar radiance data." International Journal of Photoenergy 2007 (2007).
Wang, Jianhui, The Application of Grey System Theory in Asset Securitizaton, 2007, pp. 1-3.

* cited by examiner

Figure 1- Comparison Calculations

Figure 2 - Potential Components

Figure 3- Sample PV Configuration

Figure 4- Sample SHW Configuration

IRRADIANCE MAPPING LEVERAGING A DISTRIBUTED NETWORK OF SOLAR PHOTOVOLTAIC SYSTEMS

This application is a divisional of U.S. patent application Ser. No. 12/777,224 which is a continuation-in-part of application Ser. No. 11/949,035 filed Dec. 2, 2007 entitled "Systems and Methods for Monitoring and Diagnosing the Power Generated by Renewable Power Systems" and application Ser. No. 11/673,649 Feb. 12, 2007 entitled "Systems and Methods for Providing Renewable Power Systems by Aggregate Cost and Usage."

The present invention relates to systems and methods to create irradiance mapping utilizing a distributed network of solar photovoltaic systems.

With the increasing popularity of solar panels, in has become increasingly more desirable to map the relative concentration of solar radiation hitting the earth's surface in different geographic regions. This may be useful to make determination of whether to buy a photovoltaic solar system, the appropriate size of the system and the proper angle of installation. The process of mapping the intensity of the sun is generally referred to as solar resource assessment. The output of solar resource assessment are databases that catalog the regional intensity of the solar resource, on a given number of minutes increment or an hourly basis, over the course of many years. The databases are often displayed as maps, having an appearance similar to topographic maps, and shadings corresponding to the intensity of the average annual solar resource. These maps are referred to as irradiance maps.

Constructing detailed irradiance maps is a challenging but important goal. Irradiance maps can be useful for a number of things, from estimating crop growth to estimating potential output from PV systems. Developing irradiance maps can be challenging because irradiance sensors are too expensive to deploy widely, and satellite-based methodologies tend to have wide margins of error. The present invention provides systems and method for estimating irradiance, leveraging a distributed network of PV generation systems to determine the amount of irradiance in discrete areas.

Detailed site-specific irradiance is important in a number of different ways, particularly in the context of solar power. Recent, real-time and forecasted irradiance for specific locations are important for understanding the performance of PV systems in the field, both small-scale distributed systems and large-scale solar farms. Granular irradiance data, representing typical irradiance values in specific locations, its importance for estimating potential output from future installations of solar PV systems in those specific locations. Acquiring irradiance data generally comes from one of four sources, (1) Satellite-based irradiance estimates, which while fairly reliable over long time horizons, lack enough precision to a) fully characterize the potential solar resources for existing system performance assessments or, b) accurately estimate potential output from a new system under design consideration; (2) Weather station data from somewhere in the same region. While this represents actually measured data, there are not many of these weather stations around, so the weather data is generally not precise enough for the location under consideration; (3) Historical irradiance studies: while these studies may provide reasonably accurate estimates based on historical experience, they do not solve the problem of the need for recent real-time and forecasted irradiance for specific locations; (4) One-off studies of irradiance: sometimes people may invest in irradiance monitoring equipment for a particular site that is under consideration for construction of a solar system. While precise, this solution is generally extremely expensive and time consuming.

The present invention provides systems and methods for determining irradiance data, which provides both recent real-time and forecasted irradiances, along with the capability to provide granular irradiance data for a longer history at a particular location. This methodology involves leveraging a network of distributed PV systems, and effectively using them as a network of irradiance sensors. Irradiance data derived in this way and converted into irradiance maps can be useful for any number of things beyond the scope of solar PV industry. For example, the detailed solar radiation maps can also be useful in predicting things like crop growth.

These and other features, aspects and advantages of the present invention will become better understood with reference to the following description and claims.

SUMMARY OF THE INVENTION

The present invention relates generally to systems and methods for creating irradiance mapping utilizing a distributed network of solar photovoltaic systems.

According to one embodiment of the present invention, a computer processor implemented method of developing irradiance mapping using a distributed network of solar photovoltaic systems is provided, the method comprising the steps of: selecting a predetermined geographic area having at least five solar photovoltaic systems to provide a photovoltaic system; calibrating the photovoltaic system; reversing the photovoltaic system performance model using a computer processor to solve the irradiance input value; calculating irradiance according to irradiance input value, energy output and weather data using the computer processor to provide a single irradiance point; and mapping at least two single irradiance points to create an irradiance map.

According to another embodiment of the present invention, a method of creating irradiance mapping using a distributed network of solar systems is provided, the method comprising the steps of; providing at least two solar powered systems, at least one data server, at least one generation monitoring device in communication with at least one solar powered system and at least one communication node in communication with at least one of said solar powered system, generation monitoring device and data server, determining system performance for each solar powered systems to provide system performance values; saving the system performance values in at least one data server; calibrating a system performance model for a group of at least two powered systems to provide a calibrated system performance model; saving the calibrated system performance model in at least one data server; determining an irradiance input value from the system performance values and calibrated system performance model; gathering the power generated from each at least one generation monitoring device communicated from at least one communication node and saved in a data server; determining the irradiance for a particular time according to at least one of the irradiance input value and the power generated to provide a single irradiance point; mapping at least five single irradiance points to create an irradiance map.

These and other features, aspects and advantages of the present invention will become better understood with reference to the following description and claims.

DETAILED DESCRIPTION OF THE INVENTION

Figure 1:
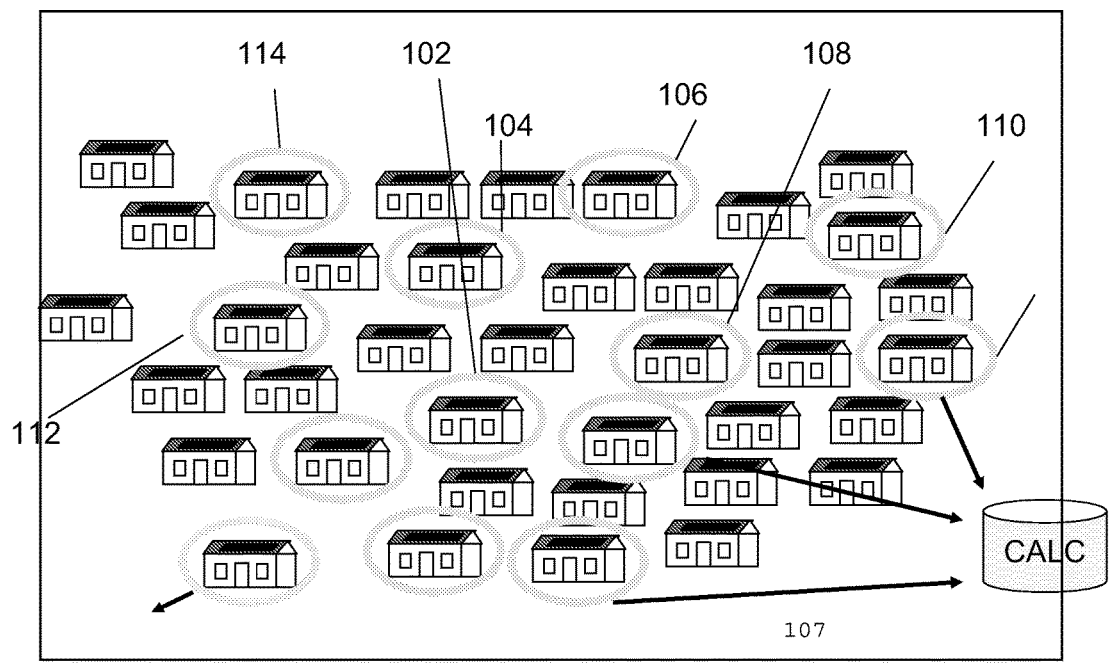
FIG. 1 depicts the present invention.
Figure 2:
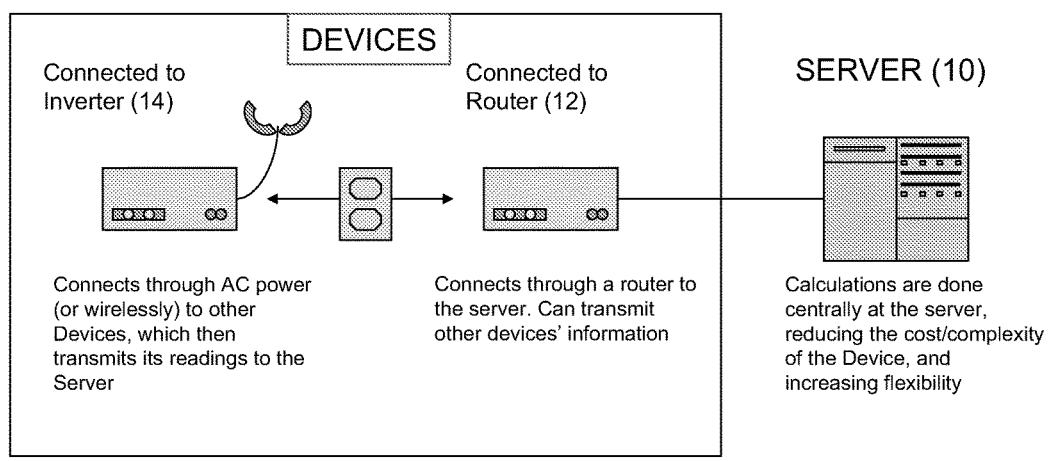
FIG. 2 depicts the present invention.
Figure 3:
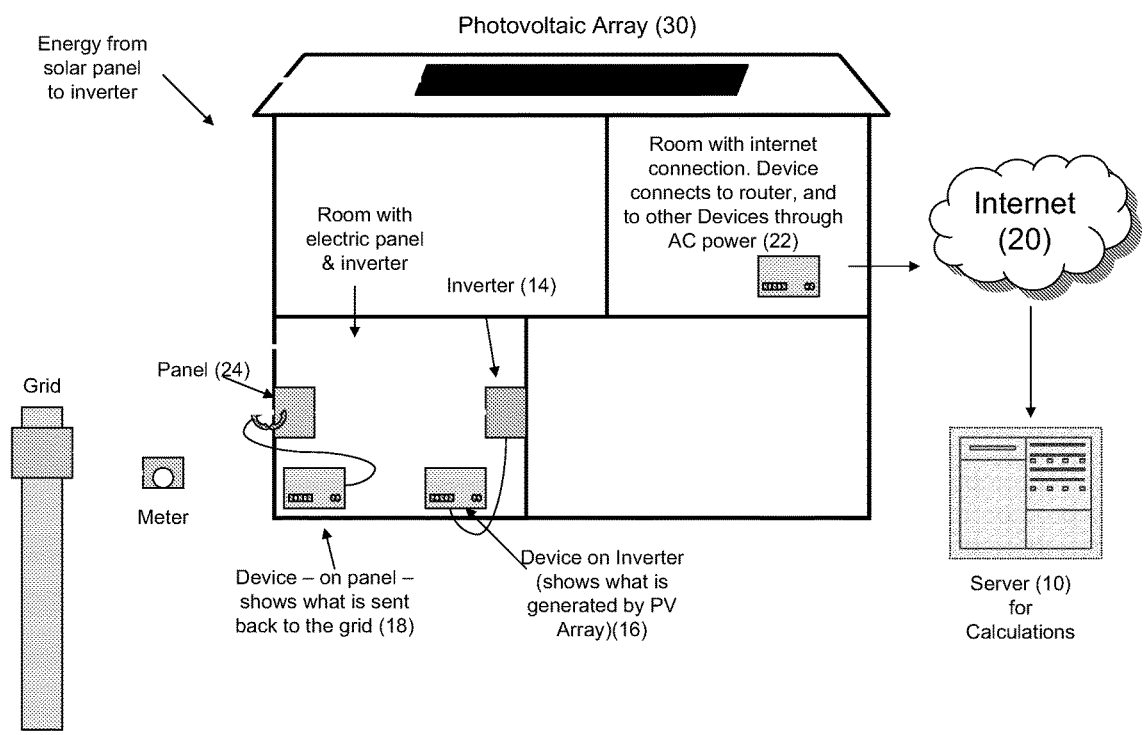
FIG. 3 depicts the present invention.
Figure 4:
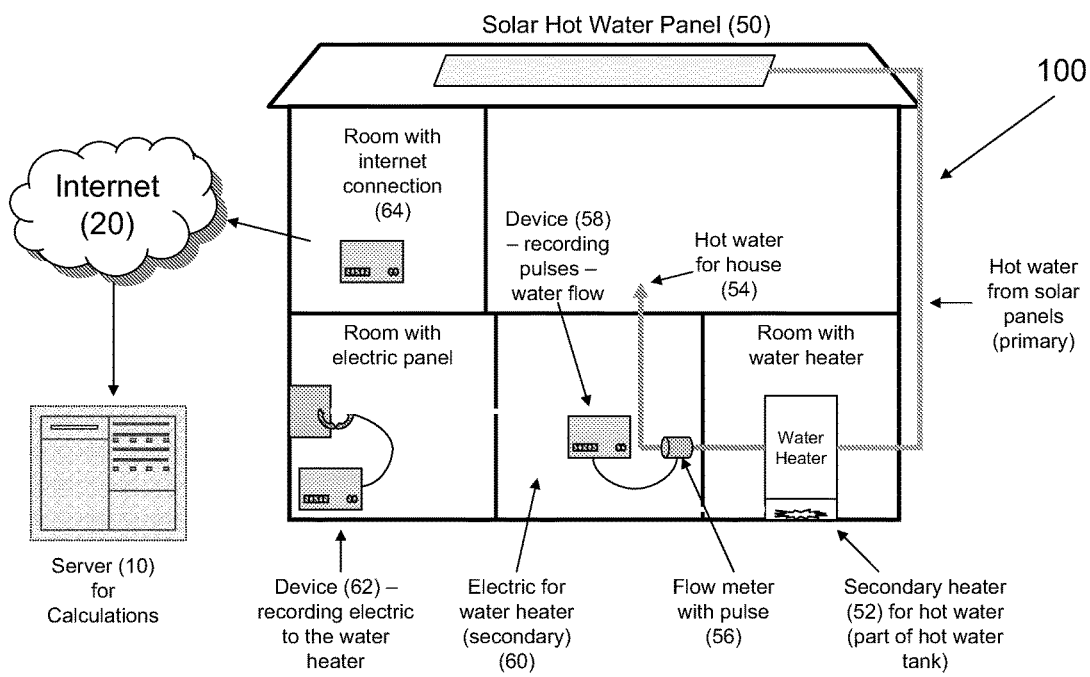
FIG. 4 depicts the present invention.
Figure 5:
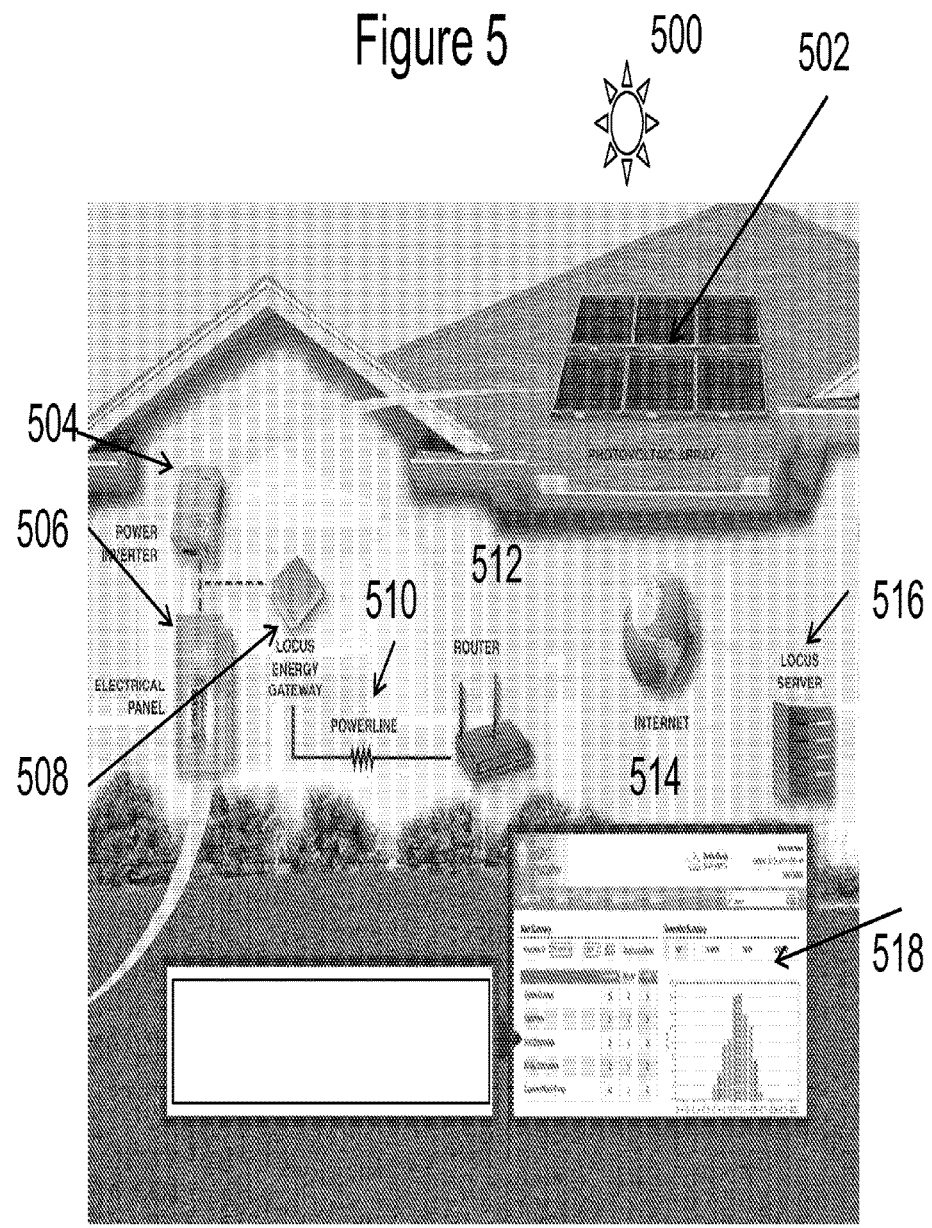
FIG. 5 depicts the present invention.
Figure 6:
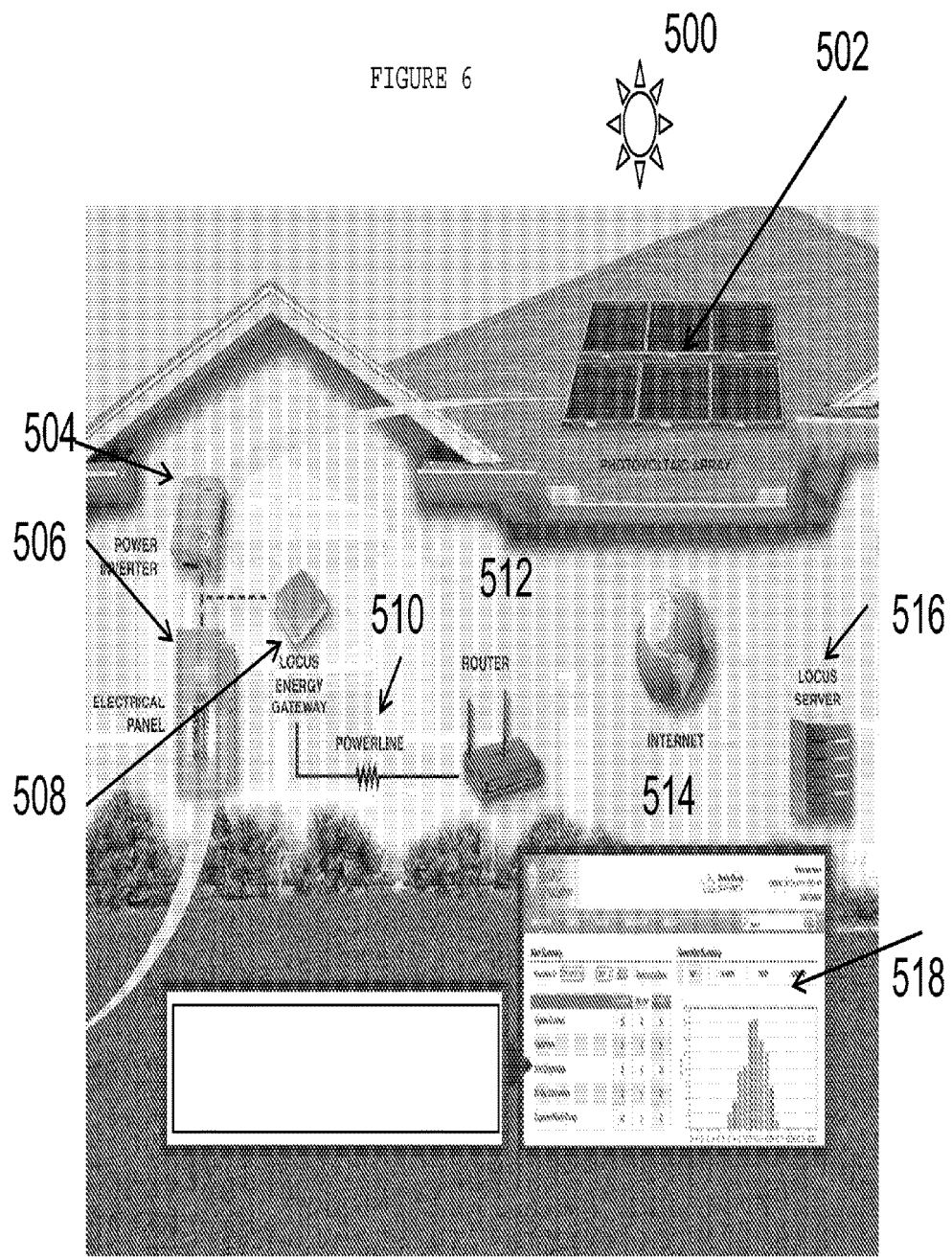
FIG. 6 depicts the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

FIGS. 1-5 provide examples of a monitored electrical system (in this case a renewable power system and more specifically a photovoltaic array solar panel also referred to herein as a solar photovoltaic system or solar powered system) for which information may be obtained. According to the example shown, there is a server 10 and at least one monitored electrical system (e.g. 102, 104, 106, 108, 110, 112) which is provided to a user or consumer. There may be at least one data server (10), at least one generation monitoring device (16) in communication with the monitored electrical system (at premise monitored electrical system (30)) and at least one communication node (22) in communication with at least one of the monitored electrical system (30), the generation monitoring device (16) and the data server (10). It should be understood the data server may be a single computer, a distributed network of computers, a dedicated server, any computer processor implemented device or a network of computer processor implemented devices, as would be appreciated by those of skill in the art. The monitored electrical system may have Background Constants that are entered into the system during data setup; populating this part of the data structure is one of the initial steps to the process. During this time, all required (or potentially required) background information may be loaded into the system. This data will later be used for system calculations and diagnostics. Background Constants may include: (1) Full Calendar with sunrise and sunset according to latitude throughout the year; (2) Insolation or 'incident solar radiation': This is the actual amount of sunlight falling on a specific geographical location. There are expected amounts of radiation which will fall on an area each day, as well as an annual figure. Specific Insolation is calculated as kWh/m2/day. The importance of this variable is that it can combine several other Background Constants; and (3) Location Functionality. It is envisioned that some of this information may be input and some may be determined automatically according to the method disclosed herein. The present invention helps determine the proximity of each system to each other system, and forms a part of the algorithm used to determine the Geographic Average of the renewable energy systems. While there are different specific methods of implementing Location Functionality, generally this relies on a large database of locations which are tied to zones. Because the relational distances between the zones are stored within the software, the distances between any two locations can then be easily and accurately calculated.

There may be the step of determining at least one Diagnostic Variable for each monitored electrical system (30). These are the variables which affect the diagnostics. Examples include: (1) Adjustments to the permitted size of each zone. When there are fewer systems within an area, the algorithm may be adjusted to allow for a statistically accurate comparison, but this would also reduce the ability of the comparison to control as well for weather, etc., since there may be more variances over the distance; (2) Adjustments to the sensitivity of the diagnostics. Changing thresholds will impact when a particular renewable energy system is identified by the software as having an issue. Each at least one Diagnostic Variable is saved into at least one data server.

The method may comprise the step of determining at least one System Coefficient for each monitored electrical system and saving each System Coefficient in the data server(s). These are set up when each new renewable energy system is entered into the software, and they provide key information about the expected performance of each system. The Coefficients will generally stay the same for the life of the system. Not all System Coefficients will be used in each comparative diagnostic, but they all may be used at some point to provide additional functionality to the process. One critical aspect of the System Coefficients is that ALL Coefficients for all renewable energy systems must be assigned using the same approach and rules. The reason for this is that if the System Coefficients are not uniformly applied, the Normalized Performance values (described below) will not be accurate. The items which can make up the System Coefficients include: (1) Expected generation by day, month and year for the system; (2) Expected generation on an ongoing basis (e.g. average generation each day, regardless of time of the year); (3) Renewable Energy system size; (4) System technology; (5) system tolerances (e.g. how accurate information from the system's components will be); (6) system shading; (7) system orientation; and (8) An 'Adjustment Factor' which can be entered by admin to adjust for how the system actual works to reduce 'false' signals if the system does not work as initially expected. This is represented as a percentage affecting the calculations. While it is a goal of the present invention to automatically detect many system coefficients, some system coefficients may be user input.

The energy generated by each monitored electrical system is recorded and the data server may then determine comparative information based upon at least one of the Background Constant, the Diagnostic Variable, the System Coefficient and the energy generated to determine a comparative value of the monitored electrical system. The term comparative value is intended to include any value that compares one system to another system or a group of systems. For example, this may be as simple as an "underperforming" designation when the system's performance is less than another system or group of systems performance in terms of power generated.

The Normalized Performance is then calculated. This is an ongoing calculation which is done for each monitored electrical system which is connected to the software. Essentially, the Normalized Performance is a monitored electrical system's actual performance for a given time period multiplied by its individual System Coefficient.

The formula for this for a given time period is:
$NP = Gen * SC$

This equation is relevant to performing Comparative Information and Comparative Diagnostics since it enables the results from disparate systems to be 'normalized' and therefore directly compared. These Normalized Performance readings can then aggregated into larger periods (24 hours, 7 days, 1 month) for comparison.

The comparative information may be a 'Geographic Average'. The Geographic Average may be calculated by an algorithm which produces an average of the Normalized Performances for each area covered. One purpose is to be able to efficiently perform comparative diagnostics regularly (e.g. every 5 minutes) for a large number of areas containing a large number of renewable energy systems without overly taxing the servers' processors. The main steps of this are as follows: (1) The software will randomly select a predetermined number (for example forty (40)) renewable energy systems within each of the algorithm's defined localities; (2) The Normalized Performance for these forty (40) systems will be summed and then divided by forty (40); (3) This results in a statistically significant Geographic Average which will then be recorded on the database; (4) An important feature of this algorithm is that much of the complexity is dealt with at the individual renewable energy system level with the System Coefficient. The simplicity of the algorithm is important for processor efficiency and ongoing data production.

There may be a comparative diagnostics process. Once the Normalized Performance and the Geographic Average are known for a given renewable energy system, these two figures can be compared to determine how well the system is performing vis-a-vis expectations. The reason the results of this are valid regardless of time of year or environmental conditions is because these factors are all controlled for within the local sampling of related systems. Based on the factors noted above which can degrade system performance, the Comparative Diagnostics can be used to determine when a monitored electrical system is performing sub optimally, therefore the comparative value may be "underperforming" or any other term indicating an issue. If the comparative value falls below certain thresholds (e.g. 7.5% below the Geographic Average signals a system issue) these diagnostics can then be used to remediate the issue and improve the system's performance. The diagnostics can be broken out into periods of different length (24 hours, 7 days and 1 month) which have the following benefits: (i) 24 Hour Comparisons: While a 5 minute segment may show variance between one renewable energy system and the group's Geographic Average, the variance may not be due to any inherent system issue (e.g. a single cloud may be temporarily affecting one system without impacting others in the vicinity). However, over a 24 hour period, these environmental factors are normally controlled for, and any significant variance will reveal a legitimate system issue. The fact that this is done over a rolling 24 hours means that the information will be received by the renewable system owner or service provider relatively quickly, without the requirement of waiting for a weekly or monthly report; (ii) Weekly Comparisons: Though this does not provide the same sort of timely information that is provided by 24 Hour Comparisons, the additional data will allow for more accurate diagnostic comparisons since environmental variables will have even less impact; (iii) Monthly Comparisons: While more accurate than Weekly Comparison, this will be used mostly as a reporting mechanism to show system status and performance.

The sample system may have at least one inverter (14) in communication with the monitored electrical system (e.g. 50, 30). The inverter (14) is an electronic circuit that converts direct current (DC) to alternating current (AC). There may also be at least one return monitor (18) determining the energy returned to a grid by said at-least one monitored electrical system. The method may have the step of determining at least one background constant and saving each background constant in the data server(s). The monitored electrical system (e.g. 30, 50) may be at least partially powered by at least one alternate energy source. There may be at least one generation monitoring device (e.g. 58), which calculates the energy generated at each consumer's premises by the monitored electrical system (e.g. 30, 50); at least one communication node (64) in communication with each at least one generation monitoring device (e.g. 58); at least one data server (10) in communication with communication node (e.g. 64), wherein the data server(s) (10) accept information from the communication node (e.g. 64) to determine the power generated at a first user's premises (100) and compare the power generated at a first user's premises (100) to Comparative Information obtained from at least two monitored electrical systems (e.g. 102, 104, 106, 108, 110, 112, 114) to determine if the first user's monitored electrical system (100) is within a predetermined deviation from the Comparative Information. This may provide a Comparative Value. The communication node may be further comprising a data storage means for storing usage information. For example, the communication node (64) may be a computer with a hard drive that acts as a data storage means for storing usage information. The generation monitoring device may be selected from the group consisting of pulse meter, temperature meter, electromechanical meter, solid state meter, flow meter, electric meter, energy meter and watt meter. There may also be at least one return monitoring device in communication with the inverter which calculates the energy returned to a grid by the system.

The monitored electrical system may be, for example, a solar system, solar panel system, photovoltaic, thermal, wind powered, geothermal, hydropower. A secondary energy source (e.g. 52) may be in communication with and at least partially powering the monitored electrical system. It should be understood, though, this is only for ancillary power in the event that the renewable energy source (50) is not capable of entirely powering the at premise monitored electrical system.

The Generation Monitoring Device may be any type of meter, by way of example, this may include a pulse meter, temperature meter, electromechanical meter, solid state meter, flow meter, electric meter, energy meter and watt meter. Each installation of the Invention will have a communication node or hub set up at the location with the system. One of the communication nodes may act as a hub. These devices connect to the internet and send the data collected by the nodes to the Server. They have the following properties: The hub has a web server and connects to a standard internet connection (Ethernet). It does not require a computer or other device to make this connection. Each hub has its own unique IP or DNS address. The hub is configured by a web browser. The web browser allows the hub to have specific nodes assigned to it. This set up feature will allow another hub in the area to be set up with its own nodes so that all can operate wirelessly without disruption. Also, the hub is able to configure specific aspects of the hub, such as the connection with the server, data recording and time settings and the ability to configure the attached nodes, including their recording properties.

The hub may connect wirelessly or through wire-line including through AC power to the various nodes in its network and may handle several nodes, sending up the data of each within a separate data stream to the server. Typically the hub would plug into a standard AC outlet and have LEDs to show operation and diagnostics. The hub may also record data, so that if the Internet connection is ever down, data from the nodes will not be lost. It will also have the option of a tamper resistant casing and minor router capabilities—so that it could stand in front of a standard router and act as the primary data entry point for a location. The hub will also be able to operate behind a router. All of the hubs may connect to a centralized database for data aggregation. This database will be able to relate the information from each node according to the time recorded. Specific data which will be saved may include: (1) hub IP#/DNS information; (2) node IP#/DNS information/name; (3) Timestamp increment; (4) Hot water flow by unit (gallon or liter) per time increment; (5) Electric flow by unit (kilowatts) per time increment; (6) Fuel flow by unit (depends on fuel type) per time increment; and (7) Other information as required (e.g. water temperature).

Each installation of the Invention will have typically one or more generation recording nodes. In this way, the step of remotely acquiring required data for at least one monitored electrical system to provide acquired electrical system data may be carried out. The generation recording node may be typically connected wirelessly to the hub, and connected directly to the inputs/outputs from the monitored electrical system. They communicate constantly with the various devices and transfer data which is then sent to the server. They may have the following properties: The first required node connects to a flow meter attached to the Water Tank that is connected to the Solar Hot Water system. This node will operate as a pulse meter, 'clicking' whenever a unit (either a gallon or a liter) of hot water passes from the tank. The second required node connects to either the electric panel at the switch for the Hot Water tank's electric power OR to a flow/other meter for gas/oil to the secondary heater for the Hot Water tank. The node may have a data storage means for storing flow/usage information. There may also be other nodes, which may be used to measure other aspects of the system and gain even more accurate readings. For example: the temperature of the hot water on an ongoing basis. The system may be monitored from a remote location (such as a computer in a different location).

It is envisioned that the present invention provides a set of devices, systems and methods to accurately and remotely measure the utilized energy generated from Solar Hot Water (SHW) systems in real-time. Specifically, the data input from a pulse meter (which is connected to a flow meter from the hot water tank) and the data input from a Watt meter (which is connected to an electrical panel for secondary electrical heating in the hot water tank) OR another pulse meter (which is connected to a flow meter on a fuel line that serves as a secondary heating source) may be calculated and software used to combine them on a centralized server. The combined data is then used to calculate the utilized energy generated by the Solar Hot Water system by determining the total amount of energy represented by the hot water used and subtracting any secondary energy (e.g. electrical or fuel) that was also used to heat the water. With additional calculations which take into account the general starting temperature of the water entering the tank and also subtracting for any energy used for other purposes (e.g. pumping water), the system will be able to isolate the precise utilized energy generated by the renewable (i.e. solar) component of the system. This will result in an accurate measurement of the renewable energy generated and consumed for a given time-period which can then be used to monitor efficiency, determine the actual payback period of the system, qualify for incentives and carbon credits, etc.

Each installation may have two or more Data Nodes. These are typically connected wirelessly to the Hub, and connected directly to the inputs/outputs from the Solar Hot Water system. They communicate constantly with the Hub, transferring data which the Hub then sends up to the server. They may have the following properties: The first Required Node connects to a flow meter attached to the Water Tank that is connected to the Solar Hot Water system. This Node will operate as a pulse meter, 'clicking' whenever a unit (either a gallon or a liter) of hot water passes from the tank. The second Required Node connects to either the electric panel at the switch for the Hot Water tank's electric power OR to a flow/other meter for gas/oil to the secondary heater for the Hot Water tank. The Node may have a data storage means for storing flow/usage information. Together, the data gathered from these Required Node connections allow the software on the serve to convert the utilized hot water into an accurate reading of utilized solar energy by subtracting the energy required to by the secondary heating mechanism. The term utilized generation refers to the energy generated by the at-premise power system, less any energy that has not been consumed by the at premise power system (e.g. the energy used to heat water that remains in the tank and is not subsequently used). Note that the term "at-premise power system" is one type of monitored electrical system, as claimed. There may also be other Nodes, which may be used to measure other aspects of the system and gain even more accurate readings. For example: the temperature of the hot water on an ongoing basis. The system may be monitored from a remote location (such as a computer in a different location).

Typically each Node connects to a specific hub. It is set up to do so through the browser interface for the Hub. The connection to the Hub is typically wireless, though these can also be connected through Ethernet wiring. Wireless transmissions between the Hub and Nodes will have data encryption. There will be the ability to create a tamper resistant casing around the Node. This is important to ensure the accuracy of the actual power utilized. The Node has two wire input areas for pulses. These, combined with the time stamp, will be sent up to the Server. The computer processor implemented server may be at a remote location. The Node also has a connection for a Watt sensor. This will have the following characteristics: The Watt sensor can handle 1-3 phase hook ups and will be compatible with clamps as well as loop sensors. According to one preferred embodiment, the basic formula to calculate utilized generation for a given period is as follows:

$$util = (f1 * temp * cony * dur) - (f2 * dur)$$

In this formula, util is the utilized generation, or utilized power generated, by the SHW system for the period, fi/is the flow in units of hot water from the hot water tank during the time increment (flow is the usage for a water heater, it may be other measures for different at premise power systems), temp variable is the difference between the starting temperature of the water when it enters the tank and when it leaves. In the basic conversion equation, this will be kept as a constant, but for systems with material changes in entry and exit temperature, these will be measured and included in the equation. An example of this would be for a system in which the cold water pipe entering the system is not insulated and is exposed to outdoor conditions, cony is a conversion constant variable which is the constant for converting the BTUs required to heat the water from the entry to exit temperature (or temp) into Kilowatts, dur variable is the period. This will generally be a month, though a shorter period may be chosen. The f12 variable is the flow in units of energy for the secondary heating source. It is important to note that the calculation will be different if the secondary heating source is provided by fuel. This is recorded in the same length increments as the f11 variable.

The components (node (100), hub (102) and server (10)) make up the required core components needed to accurately measures the actual usable output from a Solar Hot Water (SHW) system. Essentially, the hub (102) connects to multiple nodes (100) which simultaneously measure the secondary power going into the system along with the hot water going out. Controlling for any background power requirements (e.g. for pumping), it can measure the usable BTUs created by solar by analyzing the measurements at the server (104) level.

It is very important to be able to measure the usable energy generated by Solar Hot Water systems (SHW systems). As the most efficient systems available by a significant margin compared to Photovoltaics (PV), Solar Hot Water system can provide high-efficiency, inexpensive power today. But not only are they less well known/publicized than PVs, it can be difficult to precisely prove their effectiveness since there are fewer ways to efficiently measure their utilized production than with PVs. This makes accurate payback calculations more difficult, and may prevent some companies from purchasing these systems. Another important reason to be able to accurately measure the utilized power from SHW systems is to benefit from incentives. While many states have general rebates for SHW system for homeowners, larger installations, which potentially have greater commercial and environmental benefits are more difficult to apply for since an easy method of accurately monitoring the usable power generated and converting it over time into kilowatt hours is not readily available. Also, this would allow the sale/trading of carbon credits from SHW systems. The ability to remotely monitor utilized energy in real time provides addition capabilities on the part of those maintaining the solar systems in terms of their ability to find issues and increase the systems' efficiency.

Once information regarding utilized generation has been generated, it may be displayed on a portal for use in the following: determining the exact utilized power generated by the SHW system for a given duration to calculate the impact of the system (and potentially its actual payback period); Calculating utilized power for monitoring and diagnostics vis-a-vis anticipated performance; Calculating power generated for incentives and carbon credits. To determine the carbon credits, the method may comprise the step of calculating an equivalent amount of carbon which would have been created to generate the power utilized for the at least one Period to provide a carbon deficit. Also, the method may comprise the step of offering carbon credits according to the carbon deficit. The step of calculating carbon deficit may take into account any energy generated. The Carbon credit Periods may start on the first of a month and end on the last day of a month. This may match the billing cycles.

The at least one at-premise monitored electrical system may be a solar system, solar panel system, photovoltaic, thermal, wind powered, geothermal, hydropower or any other system. Also, the terms at-premises, on premises and at-premise are interchangeable and equivalent. Additionally, for those interested in heating and cooling their dwelling via renewable energy, geothermal heat pump systems that tap the constant temperature of the earth, which is around 7 to 15 degrees Celsius a few feet underground, are an option and save money over conventional natural gas and petroleum-fueled heat approaches. The term at premises renewable power system does not include conventional natural gas and petroleum fueled heat.

The method may further comprise the steps of: monitoring the system from a remote location; and monitoring the utilized generation from a remote location. The method may comprise the steps of: generating an alert when the customer variables are a prescribed percentage different than historical averages. The method may also comprise the steps of monitoring and storing the consumer's customer variables and utilized generation.

The present invention provides a computer processor implemented method of determining system configuration information of a monitored electrical system (e.g. 502) without the need for user input, the method comprising the steps of; constructing a data set of standard performance curves for at least one system type to provide a data set with at least one system type and correlated standard performance curves. Different types of systems have different signatures in the form of standard performance curves from which the system type can be identified. For example, a solar photovoltaic system tends to have an energy profile that looks like FIG. 7, and is dependent on the time of day and weather conditions. Wind generation systems tend to have an energy profile that is highly correlated with the wind speed. Residential consumption patterns tend peak in late afternoon, with offsets for any distributed generation that is located on-site. Patterns in energy data for solar PV, wind, residential consumption, etc. can be identified by comparing the pattern of the energy in the data stream to typical patterns as described above, with consideration for the time of year and weather conditions associated with the data stream. Based on the amount of data available, and how well it matches the typical patterns, a level of confidence can be assigned to identifying a data stream as coming from a particular type of system.

Figure 7:
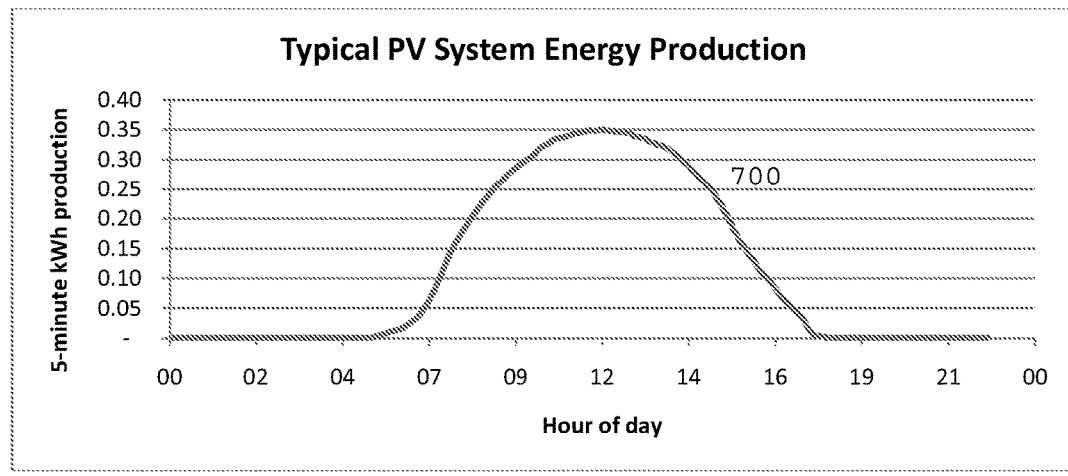
FIG. 7 depicts the present invention.

The method may comprise the step of saving the data set with at least one system type and correlated standard performance curves (for example 700, as shown in FIG. 7) in at least one data server (516). The method may next comprise the step of defining at least one characteristic feature for each at least one system type to provide at least one system type and correlated characteristic feature and saving the at least one system type and correlated characteristic feature in the at least one data server (516). A characteristic feature may be, for example, time of sunrise, time of sunset, associated timestamps, energy consumption, wind system output, weather, configuration, time of year, user habits, system size, tracker versus fixed, energy profile shape, east west orientation, north-south orientation, homeowner type, heating type, temperature sensitivity, consumption data, utilized energy, utilized generation, system derate factors and air conditioning status. It is envisioned that there may be an infinite number of characteristic features. However, it is only important that a characteristic feature be able to be attributed to a system type. There may also be a number of characteristic features assigned to a single system type. There may also be the step of providing a timestamp associated with at least one data set and saving the timestamp associated with at least one data set in the data server. The method may comprise the step of determining the required data to identify the at least one system type according to at least one of standard performance curve and characteristic feature. There may be the step of remotely acquiring required data for at least one monitored electrical system to provide acquired electrical system data; comparing system acquired electrical system data to at least one system type and correlated standard performance curves and system type and correlated characteristic features to provide system configuration information for at least one monitored electrical system to provide the specific type of at least one monitored electrical system. The specific type may refer to the type of monitored electrical system, the location, the installation angle, the system configuration, the model number or any information regarding that particular unit. The system configuration information may be selected from the group consisting of location, longitude, system size, system type and installation angle. Again, there are an infinite number things that could be system configuration information. The standard performance curve may be selected from the group consisting of energy production profile, geographic average profile, degradation due to temperature, east west orientation, north-south orientation, homeowner type, heating type and air conditioning status.

The method may further comprising the step of: determining a geographic average performance; comparing at least one monitored electrical systems performance to the geographic average performance; alerting at least one user when the at least one monitored electrical systems performance is a predetermined amount lower than the geographic average performance. The user may be the owner of the monitored electrical system, may be a renter, or simply a person who leases the equipment. It may be desirable to perform the steps of: determining if the monitored electrical system can be remotely adjusted; and remotely making a change to said at least one monitored electrical system. The present invention also envisions the steps of: loading background constants and diagnostic variables into the data server.

The methodology for completing automated remote identification, according to one aspect of the present invention, is to construct a large data set of example patterns for certain types of systems, define certain features that tend to be characteristic of the systems in the data set, and use either statistical correlation techniques, or machine learning optimization (e.g. neural networks) to define classification thresholds, nun empirical tests to determine the needed amount of data (i.e., length of history & granularity) in order to automatically identify a system type and use the developed thresholds feature sets and data history thresholds to automatically classify data streams according to different system types. It is also possible to determine the location where a particular solar powered system (generation or consumption) is physically located. This is because the characteristics of the monitored data are influenced by geographic-specific characteristics, like sunrise/sunset times or weather characteristics. As long as the monitored data stream has associated timestamps, it is possible to determine the location by finding a geographic location that would best match the observed energy consumption or generation characteristics of the monitored data stream. For example, if the type of generation source (or consumption) is known, one can model the expected behavior of this generation or consumption data stream under actual recorded weather around the world (including sunrise sunset times), and the best fitting match statistically is likely to be the actual physical location. A few specific examples of how this invention may be applied to determine a device's location follow herein. The solar photovoltaic (PV) system's output will peek at solar noon, so by examining the system's time of peak output (in UTC or some reference time zone), one can calculate the longitude and timezone a PV system is operating in. The output of solar PV systems are highly dependent upon weather. By maintaining a time history of weather conditions across a large area (e.g., North America and Europe), and modeling PV system outputs across all of these geographies, one can match the time history of a PV system's output to the geography of data it most closely matches. This matching process can be improved by narrowing the range of geographic areas (e.g. using the preceding longitudinal technique), or by improving the estimated model output of a PV system via leveraging known system characteristics (either known beforehand or identified as described in the section below about "Identification of system information for a solar PV system"). Output from a wind system is highly dependent on wind conditions. By maintaining a time history of weather conditions across a large area, and modeling the wind system outputs across all the locations, one can match the time history of a wind system's output to the geographic location it most closely matches. Energy consumption by residential or commercial users tends to be both time-of-day dependent (e.g., people come home from work and turn on the television) and weather dependent (e.g., more air-conditioners will be running on hot days). These time and weather dependencies make it possible to perform the same type of statistical matching exercise on consumption data as is done on generation data for renewable energy systems. By maintaining a time history of weather conditions across a large geographic area that the consumption system is known to be within (e.g. North America or Europe), it is possible to statistically match what the most likely location is for the consumption monitoring system.

Once a broad system type has been identified, it is possible to further refine the understanding of the system in the field by identifying the particular characteristics of those systems. This can be done by understanding the drivers of the performance of the systems in the field (e.g., weather, configuration, time of year, user habits, etc.). The following are particular configuration parameters for a solar PV system that can be identified in an automated fashion. This patent application is both for these particular detailed algorithms, as well as the broader idea illustrated here (i.e., similar types of automated configuration information can be determined for other types of systems including wind, consumption, solar thermal, etc.). The basic idea is to identify features as deviations from a typical PV standard performance curve (700), as shown in Figure Error! Reference source not found.7. The following is a non-exhaustive list of example parameters like be determined by comparing features of the data stream with the standard performance curve in FIG. 7. FIGS. 7-12 provide examples of standard performance curves and acquired electrical system data.

Figure 8:
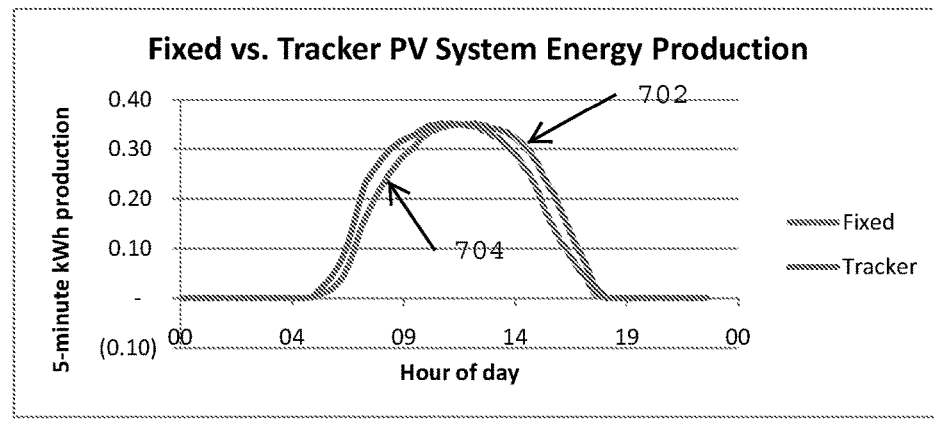
FIG. 8 depicts the present invention.
Figure 9:
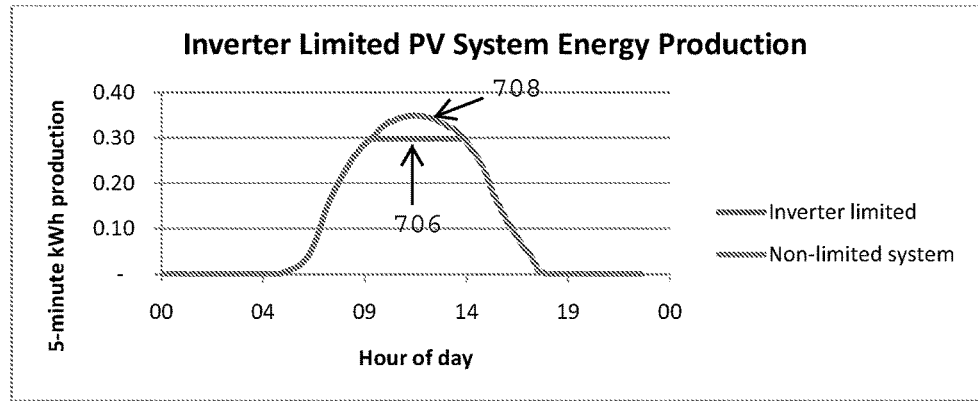
FIG. 9 depicts the present invention.

The size of a monitored electrical system, such as a PV system, can be estimated from measured outputs. If little additional system information is known, the system outputs can simply be scaled for typical PV system derates (i.e., expected losses from things like resistance in wires, inverter efficiency, etc.). If more detailed information is available on the system, either from user input, or from automatically derived parameters as described below, this more detailed information can be used to more finely tune the expected system derate factors, and therefore more accurately estimate system size. Solar PV tracker systems tend to have a less peaked energy profile, with greater total generation, as shown in FIG. 8. This is because they keep the inclined PV surface normal to sun, such that it captures more solar radiation early or late in the day. System matching this type of performance profile can be identified as tracker-type systems. The tracker profile (702) has a less peaked energy profile than the fixed (704) profile as depicted in FIG. 8. In this example, the tracker profile (702) may be the acquired electrical system data and the fixed profile (704) may be the standard performance curve. However, it could be reversed, as long as it is saved in the data set as the system type and correlated standard performance curves. In this way, either profile could serve as the standard performance curve or the acquired electrical system data. This applied for each of the curves shown in FIGS. 7-12, as long as we know what the performance curve is and the associated data set.

Solar PV designers often undersize and inverter for cost saving reasons. If the inverter is substantially undersized, this can show up as shaved peaks (706) in the PV generation profile. If these shaved peaks appear, they indicate the maximum capacity of the inverter for a particular system. An example of these shaved peaks is shown below in FIG. 9, and they can be easily identified by the flat top, where normally a curved surface (708) would appear.

Figure 10:
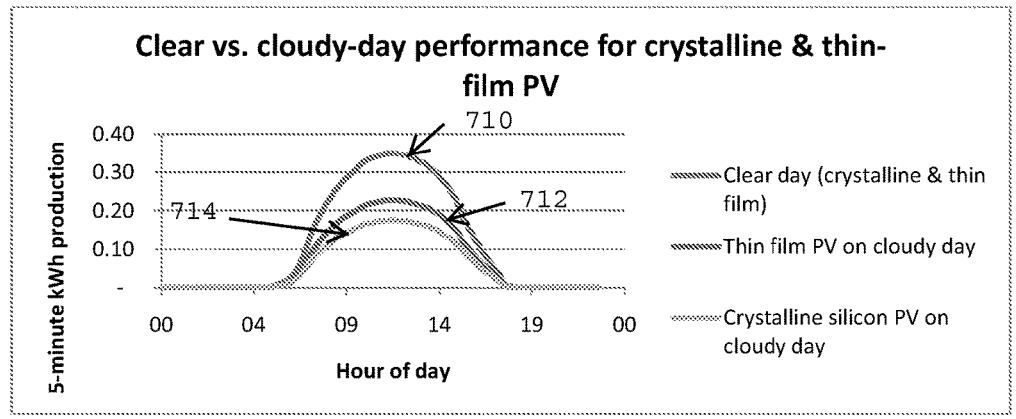
FIG. 10 depicts the present invention.

Solar PV cells produce less power under diffuse light conditions (i.e., cloudy days) than under a bright clear sunny day. Thin-film PV cells are relatively less impacted by diffuse light, as compared to polycrystalline PV cells. Examining the ratio of system performance on clear sunny days to cloudy days with diffuse light, one can differentiate between thin-film and crystalline PV systems, as shown in FIG. 10, where it can be seen that an example thin-film PV system is less impacted than a similar-sized crystalline silicon system (i.e., the ratio of B/A is greater than C/A) FIG. 10 depicts the impact of diffuse light on crystalline vs. thin film solar PV systems. FIG. 10 depicts the 5 minute kWh production by the time of day. As can be seen the clean day (crystalline and thin film) (710) system performance can serve as a measuring point to the thin film PV on a cloudy day (712) and crystalline silicon PV on a cloudy day (714). Once the performance of a particular system is obtained, it may be compared to the standard performance curves as depicted in FIG. 10 and it may be determined the type of system.

Figure 11:
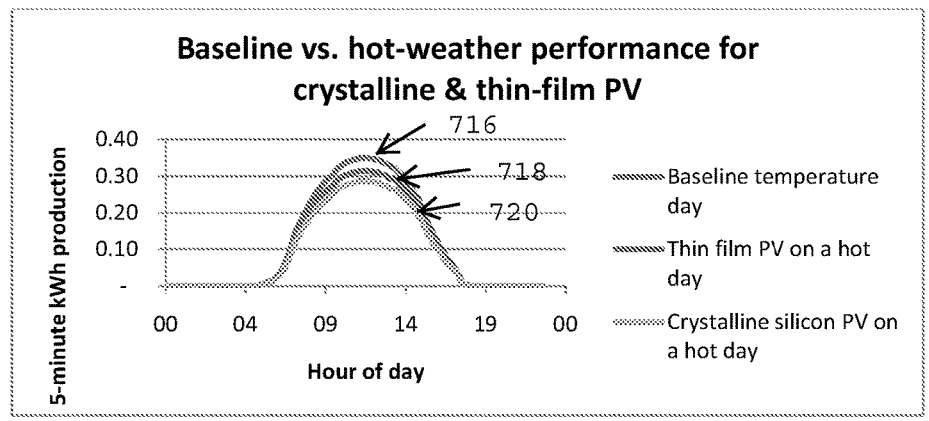
FIG. 11 depicts the present invention.

Another measure of the difference between cell technologies, is the sensitivity of those cells to temperature. At higher temperatures PV modules will produce less energy. However, the amount of degradation with an increase in temperature is dependent upon the PV technology. For example, FIG. 11 shows how crystalline silicon PV systems are more significantly affected by increases in temperature, relative to similarly sized thin-film systems. By assessing the amount of degradation due to temperature (e.g., comparing the data stream for two different days, where the measured ambient temperature was different across the days, using reference cells and various thin-film technology performance curves), one can estimate what the likely PV technology involved is.

Figure 12:
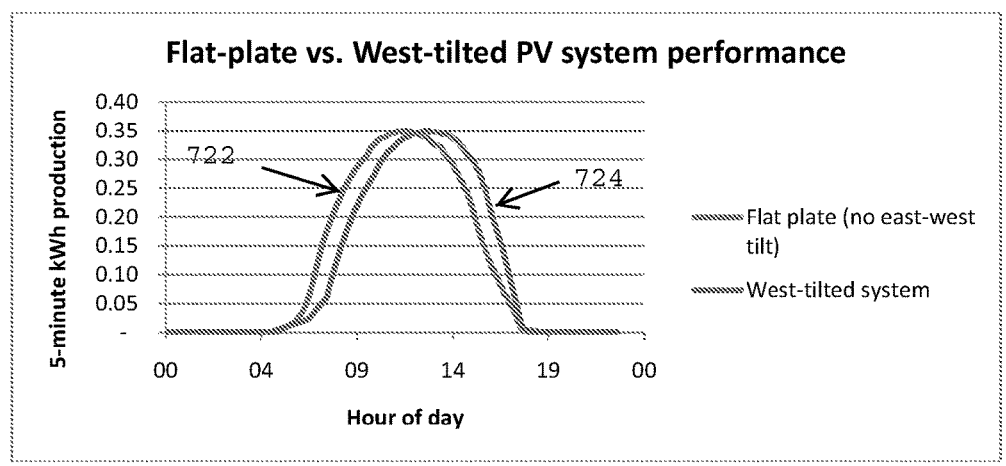
FIG. 12 depicts the present invention.

FIG. 12 depicts a baseline vs. hot-weather degradation impact for thin-film and crystalline silicon PV systems'. With respect to east-west orientation: If a PV system is perfectly flat, the distribution of energy produced in the morning and the afternoon should be roughly even, as depicted by flat plate line 722 showing no east west tilt. If the PV system is angled towards the east more energy will be produced in the morning than the evening, and vice versa if the system has a western tilt. A western-tilted PV system is illustrated in FIG. 12 as line 724. Examining the skew in the PV production data one can estimate the aggregate east-west angle of the system in question, thus determining the angle at which the PV modules are inclined from the data alone. FIG. 12 provides an example of how a western-tilted PV system has a skewed generation profile.

Figure 13:
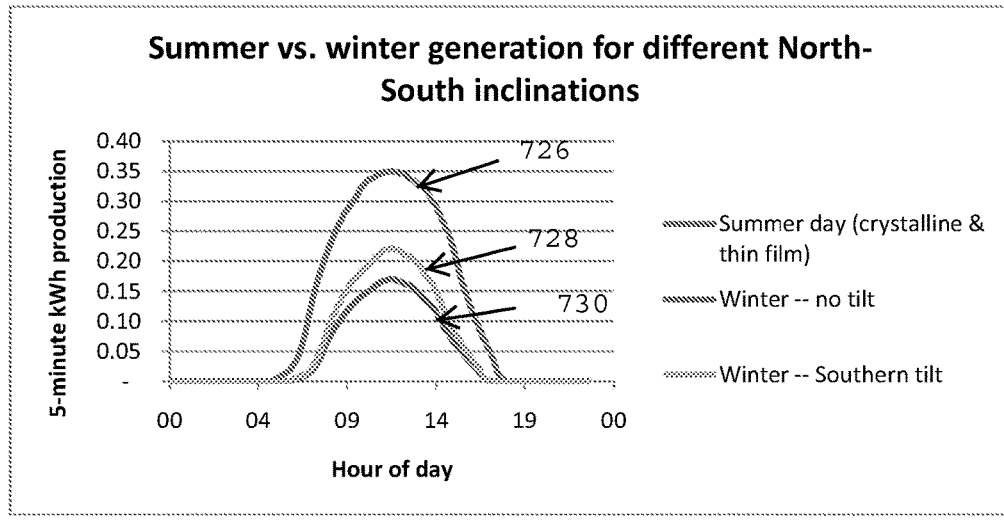
FIG. 13 depicts the present invention.
Figure 14:
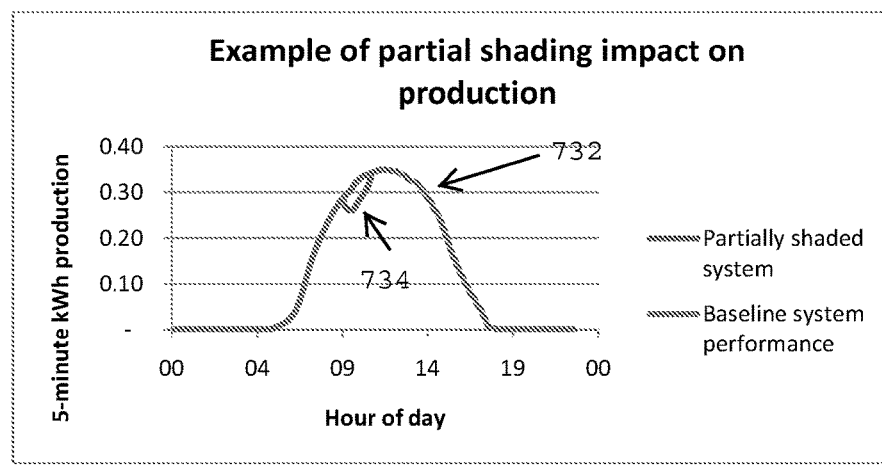
FIG. 14 depicts the present invention.

North-south orientation: the Sun is much higher in the sky in the summer than in winter, so the amount of PV generation tends to be much higher at solar noon in the summer and then solar noon in the winter, assuming a flat plate panel with no inclination. FIG. 13 depicts PV generation standard performance curve for a summer day 726, winter with no tilt 728 and winter with southern tilt 730. If the solar PV cells are angled more towards the south, the change in energy output from summer to winter will be less (and vice versa for Northern angled PV cells), as shown in 13. The ratio of summer to winter production (e.g., B/A vs. C/A in FIG. 13) is largely determined by the north-south orientation of the PV array, so with production data that spans summer and winter months, the north-south inclination can be estimated.

If a PV system is partially shaded, the shading can be detected as a dip in the otherwise expected smooth generation curve, as illustrated in 14. If this power production dip (as depicted by line 734) consistently appears over time it is indicative of some sort of shading factor (e.g., tree line, adjacent buildings, etc.). Line 734 represents acquired electrical system data for a system having a shading factor. Line 732 represents a standard performance curve. In this way, the present invention can detect a potential problem and notify the user. This may be particularly useful, for example, if a tree may be trimmed to reveal the solar panels resulting in increased production. In this way, the present invention may comprise the step of identifying a resolvable problem (e.g. a tree creating partial shading) and contacting the consumer (e.g. send the consumer an email) if the system acquired electrical system data deviates a predetermined amount from the standard performance curve.

Substantial information about the configuration of a home or business that underlies a energy consumption monitoring system can be acquired by observing the pattern of consumption data. A number of specific examples for this type of information acquisition were defined above for solar PV systems. The same idea of examining the data stream, and tying it to a underlying model of how the system works, can be used to test hypotheses for what underlies the consumption data stream. Hypotheses that prove true indicate data about the configuration of the home or business for which the consumption data is being gathered. The examples provided are intended to describe the present invention, but are not intended to be made in a limiting sense. It is envisioned the present invention in intended to be able to identify underlying demand system characteristics from the data stream.

The present invention provides a computer processor (e.g. 10) implemented method of developing irradiance mapping using a distributed network of solar photovoltaic systems (e.g. 102, 104, 106), the method comprising the steps of: selecting a predetermined geographic area having at least five solar photovoltaic systems to provide a photovoltaic system (107); calibrating the photovoltaic system (107) and reversing the photovoltaic system performance model using a computer processor to solve the irradiance input value. The step of reversing the photovoltaic system performance model using a computer processor to solve the irradiance input value may be performed according to simple methods. One example may have only two inputs:

$P = A + BT_m * H_i + CH_i + DH_i^2$, where $T_m$=PV array temperature
$H_i$=incident irradiance
P=power generated
A, B, C, and D are constants determined by least square fits The solar panels convert the irradiance to electric energy, at a rate dependent on a large number of factors. There are many possible models for this conversion process, but two of the most significant factors are temperature and irradiance. Accordingly, this is a simple power model. The temperature may obtained from a third party internet weather feed source and saved in the at least one data server. Alternatively, the temperature may be obtained by a temperate probe and saved in a data server. The present invention may perform step of calculating irradiance according to the irradiance input value, energy output and weather data using a computer processor to provide a single irradiance point; and mapping at least two said single irradiance points to create an irradiance map. There may be the step of determining an irradiance input value from system performance values, the calibrated system performance model and the temperature The energy output may be determined as the DC power from the solar PV panel is converted to AC power by an inverter. Locus Energy's gateway then measures the AC power generated Locus Energy's gateway communicates the AC power generation data (plus additional data from the inverter where available) back to a centralized server over the internet as the energy output. Using energy output, temperature, system configuration information, and other relevant data for the PV performance model, irradiance is calculated for each system in the geographic area. The irradiance calculations may be smoothed, eliminating outliers and converging on a good estimate of the average irradiance in the local region.

The present invention provides a time series sequence of observations in the form of irradiance measurements which are ordered in time. Inherent in the collection of this type of data is some form of variations. There are many methods for reducing the effect due to such variations. This may be referred to as "smoothing" or "reducing the noise". When applied, these techniques more clearly reveal the underlying trends of the data. According to one aspect of the present invention, there may be the step of smoothing at least two single irradiance points. The generated irradiance data is used to construct a detailed irradiance map of the region, and further smooth the data on longer time scales leveraging information from satellite models and new PV systems or weather stations that are installed in a given area. One manner to accomplish smoothing may be by providing moving averages. Moving averages rank among the most popular techniques for the preprocessing of time series. They are used to filter random "white noise" from the data, to make the time series smoother or even to emphasize certain informational components contained in the time series. Exponential Smoothing is also a very popular scheme to produce a smoothed Time Series. Whereas in Moving Averages the past observations are weighted equally, Exponential Smoothing assigns exponentially decreasing weights as the observation get older. In other words, recent observations are given relatively more weight in forecasting than the older observations. Double Exponential Smoothing is better at handling trends. Triple Exponential Smoothing is better at handling parabola trends. An exponentially weighted moving average with a smoothing constant a, corresponds roughly to a simple moving average of length (i.e., period) n, where a and n are related by:

$$a=2/(n+1) \text{ OR } n=(2-a)/a.$$

Thus, for example, an exponentially weighted moving average with a smoothing constant equal to 0.1 would correspond roughly to a 19 day moving average. And a 40-day simple moving average would correspond roughly to an exponentially weighted moving average with a smoothing constant equal to 0.04878.

How to compare several smoothing methods: Although there are numerical indicators for assessing the accuracy of the forecasting technique, the most widely approach is in using visual comparison of several forecasts to assess their accuracy and choose among the various forecasting methods. In this approach, one must plot (using, e.g., Excel) on the same graph the original values of a time series variable and the predicted values from several different forecasting methods, thus facilitating a visual comparison. The foregoing example of smoothing techniques are provided as examples, as can be appreciated by those of skill in the art, there are many smoothing techniques the goal of which is to more clearly reveal the underlying trends of the data.

There may be the step of utilizing comparative information from nearby photovoltaic systems to provide at least one comparative information irradiance point; and mapping the at least two single irradiance points and at least one comparative information irradiance point to create the irradiance map: This may also be actual irradiance readings from irradiance sensors. In this way, it can supplement the data achieved according to the present invention.

Figure 15:
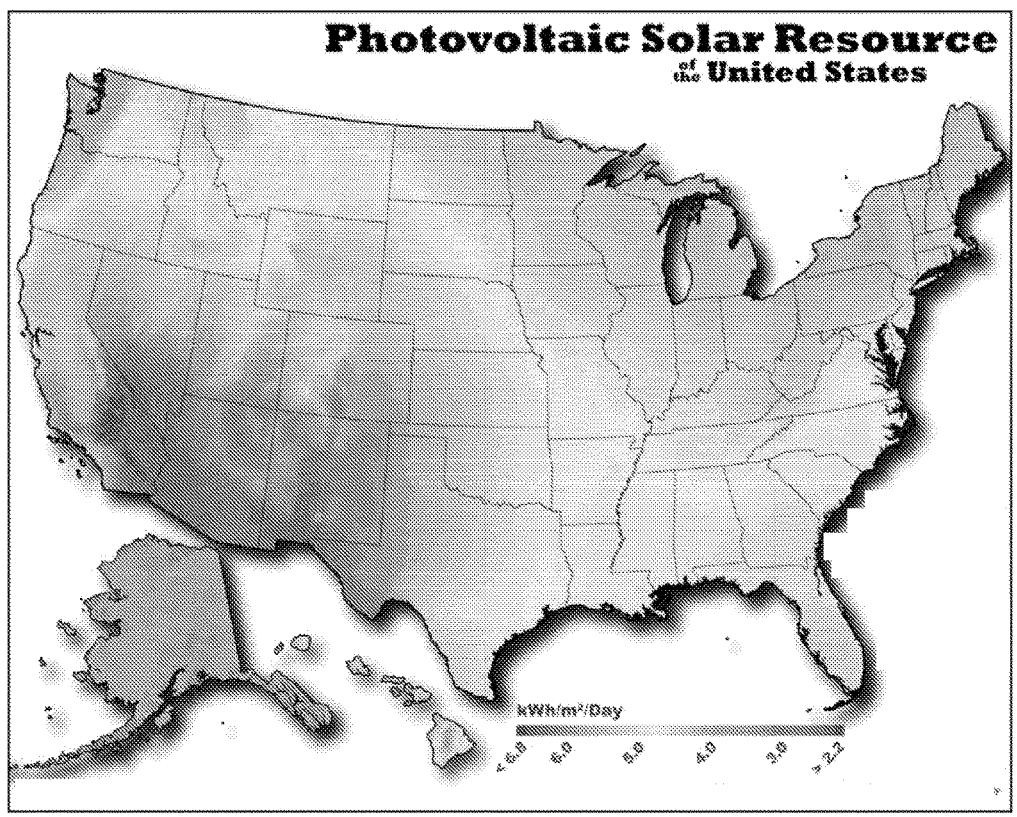
FIG. 15 depicts the present invention.

This may be repeated for other geographic areas to assemble a larger-scale irradiance map (See FIG. 15 for a sample irradiance map). Note that typically, an irradiance map may provide the amount of solar radiation in $kWh/m^2/day$. There may also be the step of predicting irradiance based on extrapolation of current data and weather forecasts.

There may be the step of automatically automatically determining system configuration information for the solar photovoltaic systems; and utilizing the system configuration information to perform the step of reversing the photovoltaic system performance model using a computer processor to solve the irradiance input value. This may be accomplished by constructing a data set of at least one standard performance curve for at least one system type to provide a data set with at least one system type and correlated standard performance curves and saving the data set with at least one system type and correlated standard performance curves in at least one data server; defining at least one characteristic feature for each at least one system type to provide at least one system type and correlated characteristic feature and saving at least one system type and correlated characteristic feature in at least one data server; determining the required data to identify at least one system type according to at least one of standard performance curve and characteristic feature; remotely acquiring the required data for at least one solar photovoltaic system to provide acquired solar photovoltaic systems data and saving the acquired solar photovoltaic systems data in at least one data server; comparing system acquired solar photovoltaic systems data to at least one system type and correlated standard performance curves and system type and correlated characteristic features to provide system configuration information for at least one solar photovoltaic system to provide the specific type of at least one solar photovoltaic system.

It should be understood that the foregoing relates to preferred embodiments of the invention and that modifications may be made without departing from the spirit and scope of the invention as set forth in the following claims.

We claim:

1. A method of creating irradiance mapping using a distributed network of solar systems, said method comprising the steps of;

providing at least two solar powered systems, at least one data server, at least one generation monitoring device in communication with at least two solar powered systems and at least one communication node in communication with at least one of said solar powered systems, said generation monitoring device and said data server;

determining system performance for each said at least two solar powered systems to provide system performance values;

saving said system performance values in said at least one data server;

calibrating a system performance model for a group of said at least two powered systems to provide a calibrated system performance model;

saving said calibrated system performance model in said at least one data server;

determining an irradiance input value from said system performance values and said calibrated system performance model;

gathering the power generated from each said at least one generation monitoring device communicated from said at least one communication node and saved in said data server;

determining the irradiance for a particular time according to at least one of said irradiance input value and said power generated to provide a single irradiance point;

mapping at least five said single irradiance points to create an irradiance map.

2. A method as in claim 1, further comprising the step of:
Utilizing comparative information from nearby systems to provide at least one comparative information irradiance point; and mapping said at least five said single irradiance points and said at least one comparative information irradiance point to create said irradiance map.

3. A method as in claim 1, further comprising the step of: smoothing said at least five said single irradiance points.

4. A method as in claim 1, wherein said step of determining an irradiance input value is from said system performance values, said calibrated system performance model and a temperature.

5. A method as in claim 1, further comprising the step of: predicting irradiance based on extrapolation of current data and weather forecasts.

6. A method as in claim 1, wherein a temperature is obtained from a third party internet weather feed source and saved in said at least one data server.

7. A method as in claim 1, wherein a temperature is obtained by a temperature probe attached to said at least two solar power systems.

8. A method as in claim 1, further comprising the step of: automatically determining system configuration information for said at least two solar powered systems;
utilizing said system configuration information to perform a step of reversing the photovoltaic system performance model using a computer processor to solve the irradiance input value.

9. A method as in claim 8, wherein said step of automatically determining system configuration is further comprising the steps of:
constructing a data set of at least one standard performance curve for at least one system type to provide a data set with at least one system type and correlated standard performance curves and saving said data set with at least one system type and correlated standard performance curves in at least one data server;
defining at least one characteristic feature for each said at least one system type to provide at least one system type and correlated characteristic feature and saving said at least one system type and correlated characteristic feature in said at least one data server;
determining the required data to identify said at least one system type according to at least one of said standard performance curve and said characteristic feature;
remotely acquiring said required data for at least one solar powered system to provide acquired solar powered system data and saving said acquired solar powered system data in said at least one data server;
comparing system acquired solar powered system data to said at least one system type and correlated standard performance curves and said system type and correlated characteristic features to provide system configuration information for at least one solar powered system to provide the specific type of said at least one solar powered system.

* * * * *